(12) United States Patent
Fletcher et al.

(10) Patent No.: US 8,782,299 B2
(45) Date of Patent: Jul. 15, 2014

(54) RE-CONFIGURABLE MULTI-PURPOSE DIGITAL INTERFACE

(75) Inventors: Mitch Fletcher, Glendale, AZ (US); Jef Sloat, Phoenix, AZ (US); Michael R. Gregg, Sun City, AZ (US)

(73) Assignee: Honeywell International Inc., Morristown, NJ (US)

( * ) Notice: Subject to any disclaimer, the term of this patent is extended or adjusted under 35 U.S.C. 154(b) by 0 days.

(21) Appl. No.: 12/768,448

(22) Filed: Apr. 27, 2010

(65) Prior Publication Data

US 2011/0264834 A1    Oct. 27, 2011

(51) Int. Cl.
*G06F 3/00* (2006.01)

(52) U.S. Cl.
USPC .................................. 710/12; 710/8

(58) Field of Classification Search
USPC ...................... 710/1, 8, 20, 29, 62, 69, 70
See application file for complete search history.

(56) References Cited

U.S. PATENT DOCUMENTS

| | | | |
|---|---|---|---|
| 3,543,048 A | 11/1970 | Klaschka | |
| 4,088,963 A * | 5/1978 | Machida et al. | 330/284 |
| 4,370,706 A | 1/1983 | Doniger et al. | |
| 4,486,826 A | 12/1984 | Wolff et al. | |
| 4,903,270 A | 2/1990 | Johnson et al. | |
| 4,967,347 A | 10/1990 | Smith et al. | |
| 4,991,174 A | 2/1991 | Mori et al. | |
| 5,136,704 A | 8/1992 | Danielsen et al. | |
| 5,276,690 A | 1/1994 | Lee et al. | |
| 5,339,408 A | 8/1994 | Bruckert et al. | |
| 5,349,691 A | 9/1994 | Harrison et al. | |
| 5,373,508 A | 12/1994 | Guliani | |
| 5,386,518 A * | 1/1995 | Reagle et al. | 710/316 |
| 5,486,777 A | 1/1996 | Nguyen | |
| 5,513,527 A | 5/1996 | Griffiths | |
| 5,563,526 A | 10/1996 | Hastings et al. | |
| 5,581,739 A | 12/1996 | FitzPatrick | |
| 5,586,124 A | 12/1996 | Nicolaidis | |
| 5,602,828 A | 2/1997 | Engdahl et al. | |
| 5,758,058 A | 5/1998 | Milburn | |
| 5,794,055 A * | 8/1998 | Langer et al. | 713/300 |
| 5,805,797 A | 9/1998 | Sato et al. | |
| 5,937,202 A | 8/1999 | Crosetto | |
| 6,023,774 A | 2/2000 | Minagawa | |
| 6,085,350 A | 7/2000 | Emmert et al. | |
| 6,150,836 A | 11/2000 | Abbott | |
| 6,255,972 B1 | 7/2001 | Gross et al. | |
| 6,260,087 B1 | 7/2001 | Chang | |
| 6,289,024 B1 | 9/2001 | Toillon | |
| 6,311,149 B1 | 10/2001 | Ryan et al. | |
| 6,448,914 B1 | 9/2002 | Younis et al. | |

(Continued)

OTHER PUBLICATIONS

USPTO Office Action for U.S. Appl. No. 12/886,276; Notification date Jun. 20, 2011.

(Continued)

*Primary Examiner* — Idriss N Alrobaye
*Assistant Examiner* — Richard B Franklin
(74) *Attorney, Agent, or Firm* — Ingrassis Fisher & Lorenz

(57) ABSTRACT

Systems and apparatus are provided for a reconfigurable, multi-purpose input/output (I/O) interface. The system comprises a comparator coupled to a means for signal generation. The system further comprises a switch fabric configured to reconfigure the I/O circuit in real time to perform a variety of signal processing, signal generation and built-in-test functions.

13 Claims, 3 Drawing Sheets

(56) References Cited

U.S. PATENT DOCUMENTS

| | | |
|---|---|---|
| 6,604,177 B1 | 8/2003 | Kondo et al. |
| 6,721,581 B1 | 4/2004 | Subramanian |
| 6,731,232 B1 | 5/2004 | Kearney |
| 6,804,292 B2 | 10/2004 | Liu et al. |
| 6,825,689 B1 | 11/2004 | Snyder |
| 6,864,822 B2 | 3/2005 | Gulati et al. |
| 6,948,091 B2 | 9/2005 | Bartels et al. |
| 7,049,989 B2 | 5/2006 | Runals et al. |
| 7,072,779 B2 | 7/2006 | Hancock et al. |
| 7,190,748 B2 | 3/2007 | Kim et al. |
| 7,215,197 B2 | 5/2007 | Regier |
| 7,301,362 B2 | 11/2007 | Jang et al. |
| 7,369,078 B2 | 5/2008 | Nickel et al. |
| 7,405,682 B2 | 7/2008 | Ebner et al. |
| 7,408,495 B2 | 8/2008 | Stein et al. |
| 7,411,538 B1 | 8/2008 | Piasecki |
| 7,505,400 B2 | 3/2009 | Bibby et al. |
| 7,516,303 B2 | 4/2009 | Kundu et al. |
| 7,548,590 B2 | 6/2009 | Koller et al. |
| 7,584,345 B2 | 9/2009 | Doering et al. |
| 7,589,649 B1 | 9/2009 | Aga et al. |
| 7,602,274 B2 | 10/2009 | Lee et al. |
| 7,609,100 B2 | 10/2009 | Nagata |
| 7,673,087 B1 | 3/2010 | Ansari et al. |
| 7,715,433 B2 | 5/2010 | Boren |
| 7,791,370 B1 | 9/2010 | Hoang et al. |
| 7,850,127 B2 | 12/2010 | Lemonovich et al. |
| 2006/0010438 A1 | 1/2006 | Brady, Jr. et al. |
| 2006/0038710 A1 | 2/2006 | Staszewski et al. |
| 2007/0063197 A1* | 3/2007 | Burkatovsky .................. 257/49 |
| 2007/0126584 A1 | 6/2007 | Hyde et al. |
| 2008/0079148 A1 | 4/2008 | Leung et al. |
| 2008/0297388 A1 | 12/2008 | Thiagarajan et al. |
| 2009/0140809 A1 | 6/2009 | Chi |
| 2009/0175381 A1 | 7/2009 | Bougard |
| 2010/0005366 A1 | 1/2010 | Dell et al. |

OTHER PUBLICATIONS

USPTO Office Action for U.S. Appl. No. 12/886,276; Notification date Nov. 25, 2011.

USPTO Office Action for U.S. Appl. No. 12/750,341; Notification date Apr. 29, 2011.

USPTO Office Action for U.S. Appl. No. 12/886,276; Notification date May 31, 2012.

USPTO Office Action for U.S. Appl. No. 12/713,712; Notification date Jul. 25, 2012.

USPTO, Notice of Allowance for U.S. Appl. No. 12/713,712 dated Oct. 11, 2012.

USPTO, Notice of Allowance issued in Application No. 12/886,276, dated Nov. 7, 2012.

* cited by examiner

US 8,782,299 B2

RE-CONFIGURABLE MULTI-PURPOSE DIGITAL INTERFACE

TECHNICAL FIELD

The present invention generally relates to signal interface circuitry, and more particularly relates to a digital input/output (I/O) signal interface that is reconfigurable for different purposes in real time.

BACKGROUND

It is estimated that it currently costs $1 million per kilogram to put a payload on the lunar surface. Further, limited power generating capability and the electrical load produced by onboard electronic circuitry result in operating issues that constrain the capability of a spacecraft of any given size and configuration. Therefore the cost, size, weight and capability of spacecraft components are always issues of concern. Frequently, trade offs must be made between cost, weight and size and capability.

In a spacecraft, command and control electronics are indispensible. Their complexity increases geometrically as demand for system capability grows. Command and control electronics monitor various conditions and components of a spacecraft using a plurality of analog and digital sensors/transducers. The command and control electronics are programmed to make a decision based in part on a sensor input and then cause the spacecraft to perform an action via a plurality of actuators that may be analog or digital devices.

Common digital interfaces include both serial busses and interfaces commonly referred to as "discrete" interfaces. Serial interfaces and discrete interfaces share the convention that the information that is conveyed has two states, which are commonly referred to as ones and zeros or binary information. Serial interfaces differ from discrete interfaces in that the information being conveyed by a discrete interface is usually only one bit; either a one or a zero. The single bit of information on a discrete interface may not change during a complete power cycle of the system it participates in or it may change frequently, but the changes are not generally made on any predetermined schedule. Serial data, on the other hand, conveys many bits of information by conveying a series of ones and zeroes at a predetermined frequency. Both interfaces are digital interfaces.

To determine the state (one or zero) of a signal applied to the input pins of a digital interface, the signal may be compared to a threshold voltage or a threshold current level. Comparator circuits of various constructions may be used for such a purpose. Some comparator circuits may receive an analog input and generate a digital output based on whether the analog input is greater than or less than the threshold value. A non-limiting example of such a comparator is a LM139 comparator circuit as described in *LM139/LM239/LM339 A Quad of Independently Functioning Comparators*, National Semiconductor Corporation, 2002, which is incorporated herein by reference in it entirety. Other comparator circuits may receive a digital input and generate a digital output based on whether the digital input is greater than or less than the threshold value.

Digital interfaces may be used for interfaces between a variety of electronic equipment that are at least partially digital. Examples of such equipment include flight control computers, launch abort systems, radios, sensor systems, star trackers and thrust vector controllers. Binary information often comes from switches that may be located throughout a spacecraft. Switches may be manually operated by astronauts or may include switches within various pieces of equipment.

Because of the growing number and complexity of digital electronics, it is desirable to minimize the size and weight of electronics that communicate digitally in order to reduce launch costs. In addition, it is desirable to minimize the electrical load generated by the electronics. Furthermore, other desirable features and characteristics of the present invention will become apparent from the subsequent detailed description of the invention and the appended claims, taken in conjunction with the accompanying drawings and this background of the invention.

Although discussed herein in the context of a spacecraft or satellite, the subject matter disclosed herein may be applied to other types of vehicles or other electronic systems. Any reference to spacecraft applications is merely exemplary and is not intended to limit the scope of the following disclosure in any way.

BRIEF SUMMARY

A re-configurable digital input/output (I/O) circuit is provided. The I/O circuit includes means for biasing an input signal when the digital I/O circuit is in a first configuration and for attenuating an input signal when the digital I/O circuit is in a second configuration, the means for biasing and attenuating comprising an input and an output. The I/O circuit also includes means for comparing the input signal to a threshold voltage having a first input and a second input. The inputs of the means for comparing are connected to the output of the means for biasing and attenuating. The I/O circuit also includes a means for transmitting an output signal connected to the input of the means for biasing and attenuating and a means for re-configuring the digital I/O circuit between the first configuration, and the second configuration.

An input/output (I/O) cell is provided. The I/O cell comprises a plurality of switch drivers, a computing device configured to control the plurality of switch drivers, and a reconfigurable I/O circuit adapted to periodically receive an input signal and to periodically transmit an output signal. The I/O circuit comprises a means for biasing the input signal when the I/O circuit is in a first configuration and for attenuating an input signal when the I/O circuit is in a second configuration and a means for comparing the input signal to a threshold voltage. The I/O circuit also includes a means for transmitting an output signal that is connected to the input of the means for biasing and attenuating. The I/O circuit may be re-configured between the first configuration and the second configuration in real time in response to the switch drivers.

BRIEF DESCRIPTION OF THE DRAWINGS

The present invention will hereinafter be described in conjunction with the following drawing figures, wherein like numerals denote like elements.

DETAILED DESCRIPTION

The following detailed description is merely exemplary in nature and is not intended to limit the invention or the application and uses of the invention. Furthermore, there is no intention to be bound by any theory presented in the preceding background or the following detailed description.

The instant disclosure is provided to further explain in an enabling fashion the best modes of making and using various embodiments in accordance with the subject matter enclosed herein. The disclosure is further offered to enhance an understanding and appreciation of the inventive principles and advantages thereof, rather than to limit in any manner the invention. The invention is defined solely by the appended claims including any amendments made during the pendency of this application and all equivalents of those claims as issued.

Further, when discussed herein below, the term "switch" means any type of electronic or physical device that opens and closes a current path through an electric circuit. The term "switch" is used for clarity and should not be construed as limiting in any way. Non-limiting examples of switching devices that may also prove useful as contemplated here include electrically controlled mechanical switches, transistors, field effect transistors (FETs), diodes based switches, contacts, nano-switches, Reed switches and the like as may currently exist or may exist in the future.

The subject matter disclosed herein provides for a re-configurable digital input/output (I/O) interface with built-in-test (BIT) capabilities. The interface features a combined digital data acquisition sub-system and a digital signal output subsystem that allows a pair of signal terminals to be used in multiple modes of operation under real time configuration control. The modes of operation are considered to be either "discrete input," "discrete output," or RS-485 modes. RS-485 is a physical layer standard defining the electrical characteristics of drivers and receivers for use in balanced digital multi-point communication systems.

According to some embodiments, the discrete input and the RS-485 input modes utilize a differential comparator circuit for the acquisition of incoming data. However, other suitably configured electronic devices with similar functionality to a comparator circuit may be used. The discrete output and the RS-485 output modes utilize a set of reference voltages, switches and configuration control logic to generate digital data and place that data on a bus. A unique incorporation of multiple function elements as described herein reduces size, weight, power consumption and heat load of an electronics package in which the digital I/O interface may be incorporated by reducing the number of components typically found in conventional I/O circuits.

Figure 1:
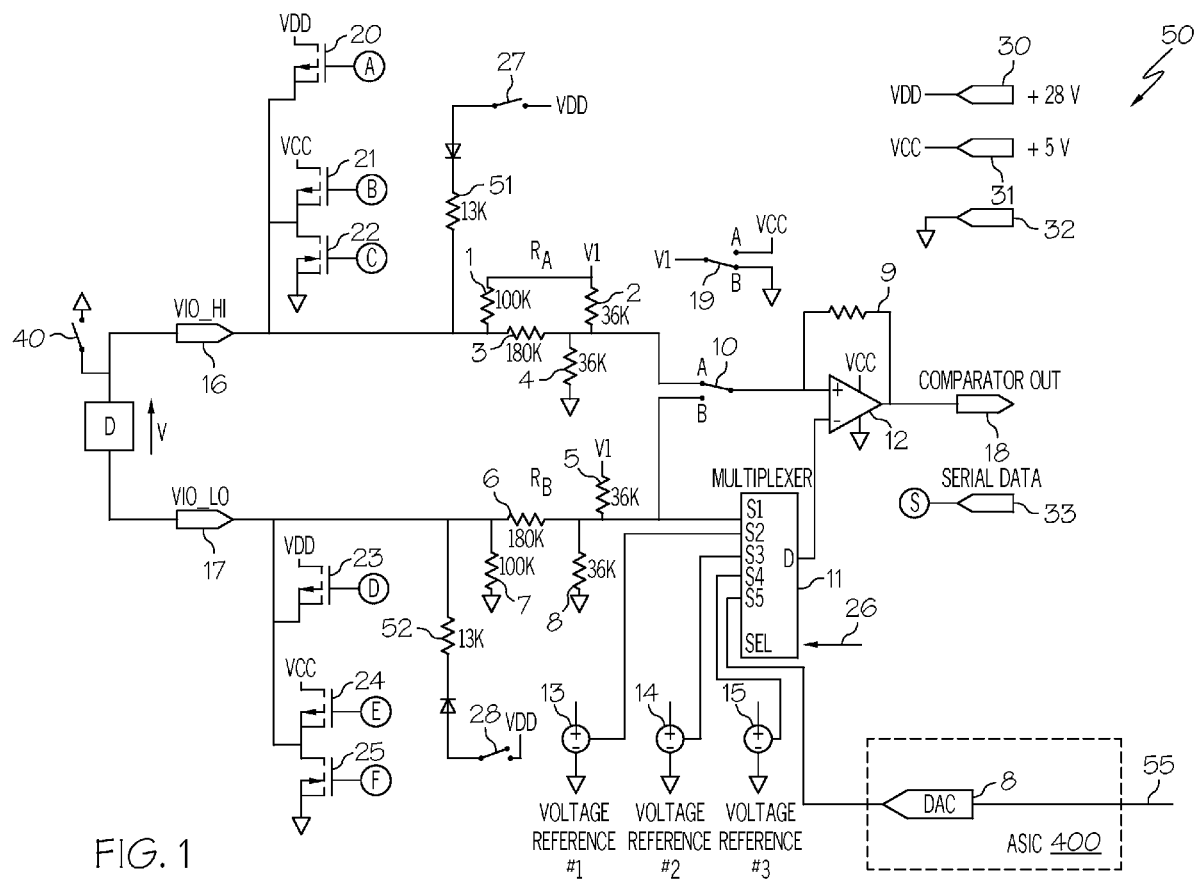
FIG. 1 is an equivalent circuit diagram for an exemplary reconfigurable multi-purpose digital interface.

FIG. 1 is an equivalent circuit diagram of an exemplary, non-limiting embodiment of a reconfigurable digital input/output (I/O) circuit 50 in accordance with the subject matter disclosed herein below. One of ordinary skill in the art will appreciate that other equivalent configurations of I/O circuit 50 may be devised without departing from the scope of the disclosure herein. The exemplary I/O circuit 50 has one dedicated signal output pin 18, which is the output from a comparator circuit 12. However, the number of output pins is merely exemplary for ease of explanation. Other embodiments may include any number or type of output pins as may satisfy a need in a particular application.

The I/O circuit 50 may also have two signal input/output pins VIO_Hi 16 and VIO_Lo 17 that may selectively be input pins to the comparator 12 or be output pins from I/O circuit 50 to other systems or sensors. As a non-limiting example of pins VIO_Hi 16 and VIO_Lo 17 acting as an output, pins VIO_Hi 16 and VIO_Lo 17 may allow a digital signal generated using switches 20-25 to be transmitted to an external device D, as will be more fully discussed below.

I/O circuit 50 may operate in various input modes. As a non-limiting example of pins VIO_Hi 16 and VIO_Lo 17 acting as inputs, I/O circuit 50 may have one or more signal paths connecting pins VIO_Hi 16 and VIO_Lo 17 into the comparator 12. The exemplary signal path(s) depicted herein comprise a first resistor network $R_A$ (resistors 1-4), which provides a signal path to the non-inverting input terminal of comparator 12, and a second resistor network $R_B$ (resistors 5-8) which provides a signal path to the inverting input terminal of comparator 12. Resistors 1-8 may have multiple functions as will be further described herein below. It will be appreciated by those skilled the art that the resistor networks $R_A$ and $R_B$ are exemplary equivalent circuits in that other circuit topologies and other circuit elements may be used to produce an equivalent or similar functionality without deviating from the scope of the disclosure herein.

In some embodiments, resistor network $R_A$ may operate as a resistor network with a small non-inverting bias with respect to $V_{CC}/2$ when configuration switch 19 is in the "A" position. Configuration switch 19 connects resistor network $R_A$ to reference voltage $V_{CC}$. Resistor network $R_A$ may bias up an incoming signal from pin VIO_Hi 16. In embodiments where configuration switch 19 is in the "B" or ground position, resistor network $R_A$ operates as a passive resistor network and attenuates any input signal incoming from pin VIO_Hi 16. For the convenience and brevity, reference voltage $V_{CC}$ is assumed to be +5 v DC, however those of ordinary skill in the art will appreciate that reference voltage $V_{CC}$ may be any suitable voltage as may satisfy a particular design requirement. Similarly $V_{DD}$ may be +28 v DC.

When acting as a biasing network, resistors 2, 3 and 4 attenuate and bias the signal present on VIO_HI 16. The resultant signal when present on the non-inverting input of the comparator 12 may be approximately one tenth the original magnitude of VIO_HI 16 and will vary about a center voltage of $V_{CC}/2$. Resistor network $R_A$ prevents large signals at VIO_HI 16 from exceeding the safe voltage levels at the input of the comparator. For example, the acceptable operational range may be in the 1-4 volt range.

Resistor network $R_A$ also allows the voltage at VIO_HI 16 to contain a common mode component that does not impair the circuit from detecting the serial data that may be present. For example, an external device may transmit serial data to this circuit whereby the amplitude of the serial data is only 300 mV but the DC bias (common mode) voltage is anywhere between −7V and +12V due to the common mode voltage present between the two devices. Because resistors 2, 3, and 4 provide bias and attenuation, the resulting signal at the comparator will remain within a range that is slightly higher than ground and slightly lower than $V_{CC}$ 31. This bias allows the comparator 12 to operate as intended.

Any serial data received at input VIO_HI 16 will be attenuated along with the common mode voltage. In this non-limiting example, the 300 mV serial data will be attenuated to approximately 30 mV in amplitude which is still large enough for the comparator to detect the data. Resistors 2, 3 and 4 also act to limit the current into or out of the comparator 12 when transient voltage conditions are present on VIO_HI 16. Transient voltage conditions may be due to lightning or power supply anomalies.

In some embodiments, resistor network $R_B$ may operate as a resistor network with a small negative voltage bias with respect to $V_{CC}/2$, when configuration switch 19 is in the "A" position connecting resistor network $R_B$ to $V_{CC}$. Resistor network $R_B$ may bias lower a signal incoming over pin VIO_Lo 17 than resistor network $R_A$ does for the signal incoming over pin VIO_Hi 16. In embodiments where configuration switch 19 is in the "B" or ground position, resistor network $R_B$ operates as a passive resistor network and attenuates any input signal incoming from pin VIO_Lo 17.

The use of a single configuration switch 19 for biasing both resistor networks $R_A$ and $R_B$ by $V_{CC}$ is merely exemplary. Those of ordinary skill in the art will appreciate that resistor network $R_A$ may be associated with the configuration switch 19 while resistor network $R_B$ is controlled by an independent sister switch (not shown). As such, resistor networks $R_A$ and $R_B$ may be operated independently or in tandem and may be biased by different voltages.

When acting as a biasing network, resistors 5, 6 and 8 of resistor network $R_B$ attenuate and bias the signal present on VIO_LO 17. The resultant signal when present on either input of the comparator 12 will be approximately one tenth the original magnitude and will vary about a center voltage of $V_{CC}/2$. This network prevents large signals at VIO_LO 17 from exceeding the safe voltage levels at the input of the comparator 12.

For example, the acceptable operational range for comparator 12 may be in the 1-4 volt range. Resistor network $R_B$ allows the voltage at VIO_LO 17 to contain a common mode component that does not impair the circuit from detecting the serial data that may be present. An external device D may transmit serial data to this circuit whereby the amplitude of the serial data is only 300 mV but the DC bias (common mode) voltage is anywhere between −7V and +12V due to the common mode voltage present between the two devices. Because resistors 5, 6 and 8 provide bias and attenuation the resulting signal at the comparator 12 will remain within a range that is slightly higher than ground and slightly lower than $V_{CC}$, which allows the comparator to operate as intended.

Any serial data received at VIO_LO 17 will be attenuated along with the common mode voltage. In this example the 300 mV serial data will be attenuated to approximately 30 mV in amplitude which is still large enough for the comparator 12 to detect the data. Resistors 5, 6 and 8 also act to limit the current into or out of the comparator 12 when transient voltage conditions are present on VIO_LO 17. Transient voltage conditions may be due to lightning or power supply anomalies.

As for resistors 1 and 7, resistor 1 provides a small pull-up current to the VIO_HI 16 while resistor 7 provides a pull-down current to the VIO_LO 17. These resistors provide some immunity from noise as noise signals would need to overcome the bias currents to be recognized as data by the comparator 12. Additionally, these resistors 1, 7, will cause the state of the comparator 12 to be predictable and stable in the event the pins VIO_Hi 16 and VIO_Lo 17 are not connected to another device D.

In some embodiments, where configuration switch 19 is in the "B" position, resistor networks $R_A$ and $R_B$ may serve as isolation and attenuation resistors protecting the comparator 12 from over current and over voltage conditions during periods of time when output signals are being transmitted from pins VIO_Hi 16 and VIO_Lo 17. The resistor networks $R_A$ and $R_B$ also protect from transient conditions on signal wires that are external to the I/O circuit 50 that may be due to lightning and power supply anomalies. The resistance values of the resistors 1-8 illustrated in FIG. 1 are merely exemplary. Those of ordinary skill in the art will appreciate that the functionality provided by the resistors 1-8 may be provided using resistor networks with alternative topologies and or with resistors of other sizes and still fall within the scope of the disclosure herein. Resistance networks $R_A$ and $R_B$ may also include suitable capacitors or inductors as may address a particular design requirement.

Comparator 12 may be any suitably configured circuit or device capable of comparing a first voltage to a threshold voltage and outputting a digital indication of whether the threshold is being surpassed or not. As a non-limiting example, the comparator 12 may be based on an LM139 comparator circuit manufactured by National Semiconductor Corporation of Santa Clara Calif.

Comparator 12 compares an input voltage received at its non-inverting input terminal to a threshold voltage received at its inverting terminal. If the voltage received at the non-inverting terminal exceeds the threshold voltage input to its inverting terminal, a logical high state (i.e. a "1") is generated. Conversely, if the voltage received at the non-inverting terminal does not exceed the threshold voltage, a logical low state (i.e. a "0") is generated. Those of ordinary skill in the art will appreciate that resistor 9 is utilized to prevent oscillation conditions by adding a small amount of positive feedback or hysteresis.

Multiplexer 11 may be any suitably configured multiplexer currently existing in the art or that may arise in the future. Multiplexer 11 is configured as a multi-input switch that receives one of a plurality of exemplary voltages 13-15 and 80. Upon receipt of a command input 26 (manual or automated), multiplexer 11 switches in one of the plurality of voltages 11-13 or 80 as the reference voltage to comparator 12. The reference voltages may be fixed reference voltages such as referenced voltage sources 11-13, or may be an adjustable reference voltage such as the digital-to-analog converter (DAC) 80. In essence the multiplexer 11 is a multi-input/single output switch.

As a non-limiting example, the multiplexer 11 is illustrated as having five voltage sources that may be switchably connected to the inverting terminal of the comparator 12. Activating input 51 connects the input signal from VIO_Lo 17. Activating inputs S2-S4 may connect one of the plurality of fixed reference voltage sources 13-15. Activating input S5 connects an input from a digital-to-analog convertor (DAC) 80.

The DAC 80 may be any suitably configured digital-to-analog converter currently available or that may arise in the future. The DAC 80 provides threshold voltages to the comparator 12, the need for which may be scheduled or may be emergent. Or, the DAC 80 may provide voltages that may lend themselves to a finer determination of any input voltages at received pins VIO_Hi 16 and/or VIO_Lo 17. DAC 80 also provides for a more robust BIT capability in that the use of a controllable and more finely calibrated reference voltage allows a determination to be made whether one or more components in I/O circuit 50 may be near failing.

The I/O circuit 50 also includes a switch fabric that comprises configuration switches 10, 19, 20-25 and 27-28 and the multiplexer 11. It should be reiterated that FIG. 1 is an exemplary equivalent circuit for the I/O circuit 50. The actual structure of I/O circuit 50 may be implemented using a number of alternative topologies, alternative electronic devices and alternative switches and switch locations without departing from the scope of the subject matter disclosed herein.

I/O circuit 50 also may operate in an output mode whereby digital signals may be transmitted from pins VIO_Hi 16 and VIO_Lo 17 to other destinations. The digital signals are created by opening and closing switches (e.g. FETs) 20-25 that apply a voltage at pins VIO_Hi 16 and VIO_Lo 17. The voltages are created by supply voltages $V_{CC}$ 31 (e.g. +5 VDC) or $V_{DD}$ 30 (e.g. +28 VDC) or ground 32 (e.g. 0 VDC). When switches (20-25) are open and shut, pulses or step functions are created. Resistor networks $R_A$ and $R_B$ and comparator 12 serve to provide a feedback path for the outputs such that a BIT can be performed when the I/O circuit 50 is in an output mode.

When the circuit is employed to provide a differential serial data output, the switches open and close at a predetermined frequency to provide serial bits of information. The output signals are then in the form of square waves with the voltages on VIO_Hi 16 and VIO_Lo 17 of equal and inverted shape. This is accomplished by switching the transistors off and on at the proper times in response to the digital serial data 190 provided on the serial data pin 33 and by the configuration logic 140 and the FET drivers 120.

When RS485 transmission is desired the square waves would be generated by switches 21, 22, 24 and 25 to provide switching between 5V and ground.

Other physical layer serial bus standards such as RS232 could be generated by the use of other voltages. In the case of RS232, the transmit half of the serial data communication could be done with the output transistors on one pin 16 or 17 and the serial data reception could be done on another pin 16 or 17 using the appropriate voltages and voltage thresholds.

In some embodiments, configuration switches 27 and 28 may be closed to provide a wetting current to an external switch(es) 40 in certain modalities. An external switch 40 would normally be connected to either VIO_Hi 16 or VIO_Lo 17 and to an external ground. A separate external switch may be connected to each of VIO_Hi 16 and VIO_Lo 17 to provide two separate bits of information. A wetting current is the minimum current needing to flow through a newly-closed mechanical switch or relay in order to break through any film (i.e. contact oxidation) that may have been deposited on the switch contacts while open. In preferred embodiments, a 10 mA wetting current is adequate for space products.

As discussed above, the I/O circuit 50 is reconfigurable in real time to accomplish a number of functions utilizing some of its components in different topologies. This is done by utilizing the switch fabric to switch in, switch out and re-combine different circuit elements.

Table 1 is a modality table that relates the functionality of the I/O circuit 50 to the condition of the switch fabric thereof. Table 1 presents the positioning of the configuration switches 10, 19, 27, 28, 20-25 and multiplexer 11. In Table 1, "C" indicates "closed", "O" indicates "open", "D" indicates "dynamically operated" and "X" indicates "positional indifference."

TABLE 1

Re-Configurable I/O Circuit Modalities of FIG. 1

| MODE # | Mode | Switches & Mux 11 | | | | | Transistor number | | | | | |
|---|---|---|---|---|---|---|---|---|---|---|---|---|
| | | 10 | 11 | 19 | 27 | 28 | 20 | 21 | 22 | 23 | 24 | 25 |
| 1 | RS485 Differential Serial Data Input, BIT Ready | A | S1 | A | O | O | O | O | O | O | O | O |
| 2 | RS485 Differential Serial Data Out, BIT on, BIT Ready | A | S1 | A | O | O | O | D | D | O | D | D |
| 3 | VDD/open output on VIO_HI, BIT ready | A | S2 | B | O | O | C | O | O | X | X | X |
| 4 | VDD/open output on VIO_LO, BIT ready | B | S2 | B | O | O | X | X | X | C | O | O |
| 5 | VCC/open output on VIO_HI, BIT ready | A | S3 | B | O | O | O | C | O | X | X | X |
| 6 | VCC/open output on VIO_LO, BIT ready | B | S3 | B | O | O | X | X | X | O | C | O |
| 7 | GND/open output on VIO_HI, BIT ready | A | S4 | A | O | O | O | O | C | X | X | X |
| 8 | GND/open output on VIO_LO, BIT ready | B | S4 | A | O | O | X | X | X | O | O | C |
| 9 | GND/Open input with pull up on VIO_HI, BIT ready | A | S4 | X | C | O | O | O | C | X | X | X |
| 10 | GND/Open input with pullup on VIO_LO, BIT ready | B | S4 | X | O | C | X | X | X | O | O | C |
| 11 | VDD/Open input on VIO_HI, BIT ready | A | S2 | B | O | O | O | O | O | X | X | X |
| 12 | VDD/Open input on VIO_LO, BIT ready | B | S2 | B | O | O | X | X | X | O | O | O |
| 13 | VCC/Open input on VIO_HI, BIT ready | A | S3 | B | O | O | O | O | O | X | X | X |
| 14 | VCC/Open input on VIO_LO, BIT ready | B | S3 | B | O | O | X | X | X | O | O | O |
| 15 | GND/Open input no pullup on VIO_HI, BIT ready | A | S4 | B | O | X | O | O | O | X | X | X |
| 16 | GND/Open input no pullup on VIO_LO, BIT ready. | B | S4 | B | X | O | X | X | X | O | O | O |

In Mode 1 of the exemplary embodiment of FIG. 1, a differential serial data input signal is received from an external transmitting device D connected to pin VIO_Hi 16 and pin VIO_Lo 17. External device D may be switchably coupled to input/output pins VIO_Hi 16 and VIO_Lo 17 by switch 40. This input signal may be a signal conforming to the RS-485 physical layer signaling standard and will be referred to herein as the RS485 mode when such is the case.

When configuration switch 19 is in the "A" position, $V_{CC}$ is connected into the circuit as $V_1$ which biases the resistor networks $R_A$ and $R_B$. When configuration switch 10 is in its "A" position, pin $VIO_{Hi}$ is coupled to the non-inverting input of comparator 12. The multiplexer 11, by activating switch S1, couples the pin VIO_LO 17 to the inverting input of the comparator 12. All other switches are in an open state. As discussed above, the biased resistor networks $R_A$ and $R_B$ act to attenuate the common mode voltage along with the serial digital signal. The attenuation allows the common mode voltage to be rejected as the comparator 12 can still differentiate the attenuated signal as the input remains in the safe input region of the comparator 12. This process leaves a smaller 100-300 mV RS-485 signal that may have been riding on the common mode voltage as the differential input to the comparator 12.

When the attenuated RS-485 signal from pin VIO_Hi 16 exceeds the attenuated signal from pin $VIO_{Lo}$, a logical "0"

may be generated by the comparator 12 for output to pin 18. When the attenuated signal from pin VIO_Hi 16 does not exceed the attenuated signal from pin VIO_Lo 17, a logical "1" may be generated by the comparator 12 for output pin 18. However, one of ordinary skill in the art will recognize that an alternative comparator or comparator configuration may be used that reverses the outputs from the comparator 12 for a given differential input.

The exemplary embodiment of FIG. 1 may also be configured in real time to transmit a digital data signal. In Mode 2, the I/O circuit 50 may transmit a differential serial data signal across pins VIO_Hi 16 and VIO_Lo to an external device D. The differential serial data output signal may be transmitted conforming to the RS-485 physical layer standard. In Mode 2, the pins VIO_HI 16 and VIO_LO 17 must perform in synchronous operation to provide a differential serial data stream to conform to serial data standards such as the RS485 standard.

In Modes 3 through 16 the operation of the two pins VIO_HI 16 and VIO_LO 17 may be independent as each pin may be connected to a different device D. For example, VIO_HI may be in Mode 3, outputting either $V_{DD}$ (switch 20 energized) or providing only small load to the external device D via a resistor network $R_A$ (switch 20 not energized). At the same time VIO_LO 17 may be operating in Mode 8, providing either a ground signal with switch 25 energized or a "pull-up" via resistor 52 and configuration switch 28. VIO_HI 16 can be in any of modes 3, 5, 7, 9, 11, 13 or 15 while VIO_LO 17 can be in any of modes 4, 6, 8, 10, 12, 14 or 16.

With configuration switches 10 and 19 remaining in their "A" positions, and the multiplexer 11 coupling the pin VIO_Lo 17 to the inverting input of the comparator 12, switches 21, 22, 24 and 25 may be dynamically opened and closed to generate a serial digital data stream. For example, when switch 21 is energized shut, $V_{cc}$ is applied to output pin VIO_Hi 16. When switch 22 is energized shut, the voltage at output pin VIOHi is shorted to ground thereby providing zero volts at output pin VIO_Hi 16. The same operation is performed by switches 24 and 25 in regard to output pin VIO_Lo 17. By selectively opening and shutting switches 21, 22, 24 and 25, a series of voltage step functions are generated such that a stream of square waves (i.e. 1's and 0's) is transmitted from the output pins VIO_Hi 16 and VIO_Lo 17 to exterior device D.

The exemplary embodiment of FIG. 1 may also be reconfigured in real time to transmit a discrete output voltage on either of the pins, VIO_HI 16 or VIO_LO 17. Either output may be monitored by comparator 12 as a BIT to verify that the correct voltage level is present on the pins VIO_HI 16 and VIO_LO 17. Modes 3-10 from Table 1 are variations of this particular mode.

For example, in regard to Mode 3, $V_1$ has been set to ground by placing configuration switch 19 in the "B" position. Resistor networks $R_A$ and $R_B$ have thereby been configured to be substantially identical passive resistor networks that attenuate signals from pin VIO_Hi 16 and VIO_Lo 17 before they are input to comparator 12. Resistor networks $R_A$ and $R_B$ protect the comparator 12 from current and voltage overload.

By placing configuration switch 10 in the "A" position, output pin VIO_Hi 16 is connected to the non-inverting input of comparator 12 for BIT capability. The threshold voltage to which the voltage at pin VIO_Hi 16 is compared is selected by directing the multiplexer 11 to connect any one of the exemplary fixed reference voltages 13-15 or the variable DAC 80 to the inverting input of the comparator 12. In Mode 3, for example, the reference voltage is selected as the reference voltage 13 by activating input S2 of the multiplexer 11.

Output signals transmitted to devices D from pin VIO_Hi 16 or VIO_Lo 17 are determined by the order in which the switches (i.e. FETs) 20-25 are opened and closed. Switches 20-25 may thereby be used to create a plethora of serial digital signals. Switches 20/23 connect voltage $V_{DD}$ (e.g. 28 VDC) to pins VIOHi or VIOLo. Similarly, switches 21/24 connect voltage $V_{CC}$ (e.g. 5 VDC); and switches 22/25 may be used to drive the output at pins VIO_Hi 16 and/or VIO_Lo 17 to zero by connecting pins VIO_Hi or VIO_Lo to ground.

The exemplary switches 20-22 may be controlled separately for the exemplary switches 23-25. Therefore, an output signal from pin VIO_Hi 16 may be generated independently from the output signal from pin VIO_Lo 17. Configuration switch 19 in the "B" position removes the bias voltage V1 from the resistor networks $R_A$ and $R_B$. Placing configuration switch 10 connects either one of pins VIO_Hi 16 and VIO_Lo 17 to the non-inverting input of the comparator 12 such that their respective signals may be monitored via the comparator 12.

One of ordinary skill in the art will recognize that other reference voltages may be used and that additional switches may be included in parallel to switches 20-25 to add additional signaling flexibility. Similarly, it will be appreciated that additional variable reference voltages may be included to increase the accuracy of the feedback through comparator 12.

In regard to Modes 7-8, switches 22 and 25 are shut and switches 20, 21, 23 and 24 are open. Switches 22 and 25, respectively, are shunting pins VIO_Hi 16 or VIO_Lo 17 to ground 32. Therefore, configuration switch 19 is connected to $V_{CC}$ to provide BIT capability. When the circuit is working as intended, the comparator 12 will confirm that the voltages at VIO_HI 16 and VIO_LO 17 are below a predetermined voltage using multiplexer 11 input S4, for example, as a threshold voltage. This is done in two operations; once with switch 10 in position A to verify the output on VIO_Hi 16 and separately with switch 10 in position B to verify the output on VIO_Lo 17.

In regard to Modes 9 and 10, configuration switches 27 or 28 are closed to provide a pull up voltage and a wetting current to pins VIO_Hi 16 or VIO_Lo 17 if the external device(s) do not provide their own. In these modes the external devices D may be switches that connect VIO_Hi 16 or VIO_Lo 17 to ground or are open. In some embodiments, the wetting current may be in the range of 10 mA. In some embodiments, the wetting current may be in the range of 10 mA. Resistors 51 and 52 may need to be adjusted to produce the correct current for a particular voltage VDD (e.g. 28 V). Under Ohm's law this may be accomplished by switching in an additional resistor (not shown) of about 3.4KΩ in parallel with the 13KΩ resistor identified as resistor 51 in FIG. 1 to produce a 2.7 KΩ equivalent resistance.

In some embodiments concerning Modes 11-16, configuration switch 19 is set to the "B" position, thereby connecting $V_1$ to ground and removing the bias voltage $V_1$ from resistor networks $R_A$ and $R_B$. As described above in regard to Modes 7-10, configuration switch 10, connects an incoming signal from one of pins VIO_Hi 16 or VIO_Lo 17 to the non-inverting input of comparator 12. Multiplexer 11 connects one of reference voltages 13-15 or DAC 80 to the inverting input of comparator 12. As such, comparator 12 generates an output bit after comparing the attenuated input signals with the reference voltages 13-15 or DAC 80 as described above. It should be noted that switches 20-22 must be open so as to not interfere with the input signal connected to pin VIO_Hi 16.

Similarly, switches 23-25 must be open so as to not interfere with the input signal connected to pin VIO_Lo 17.

Transistors 20-25 also provide a BIT capability in modes 9-16 when the nature of the external devices connected to the IO pins 16-17 is considered. The transistors 20-25 may be used when the external devices D are unpowered or driven to the neutral (open) state to apply the respective voltages to the IO pins 16-17 allowing the comparator 12 to verify the functionality of the various components. Typically these tests apply the voltages to the IO pins VIO_Hi 16 and/or VIO_Lo 17 briefly to prevent harm from any large currents that may occur due to failures in the circuit or due to any external voltages.

Further, configuration switches 27 and or 28 may be closed to provide a wetting current to an external switch 40. A wetting current (or sealing current) is the minimum current needing to flow through a newly-closed mechanical switch or relay in order to break through any film (contact oxidation) that may have been deposited on the switch contacts while open.

Modes 15 and 16 are similar to Modes 9 and 10 in that modes 9, 10, 15 and 16 are used to interface with devices D that are either grounds or open circuits. In modes 9 and 10 pull up and wetting currents are provided by closing switches 27/28. In modes 15 and 16, configuration switches 27 and 28 are open because the external devices connected to the IO pins 16 and 17 are assumed to provide the pull up and wetting current function if they are needed.

Figure 2:
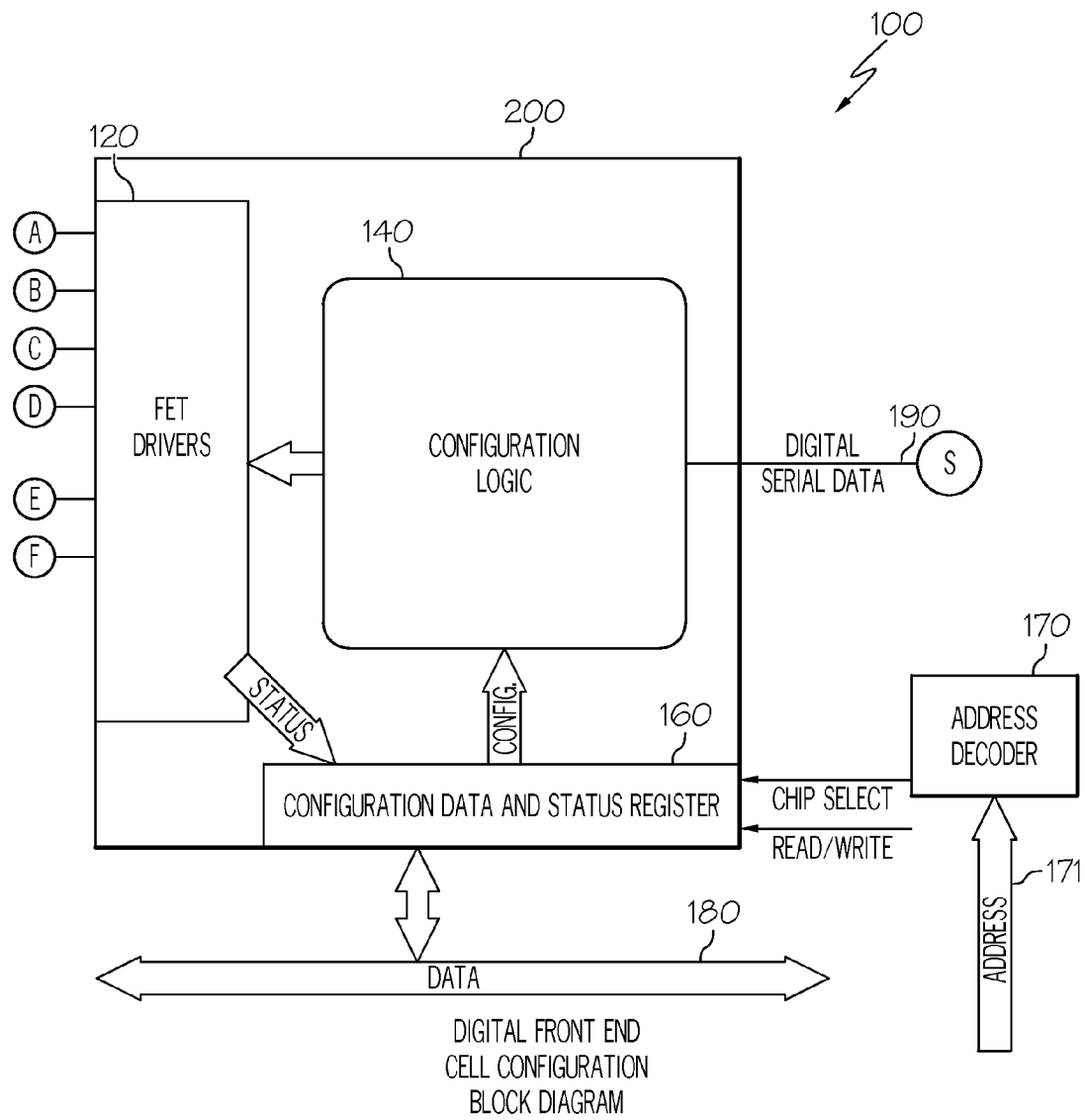
FIG. 2 is a block diagram for a control cell for the exemplary reconfigurable multi-purpose digital interface.
Figure 3:
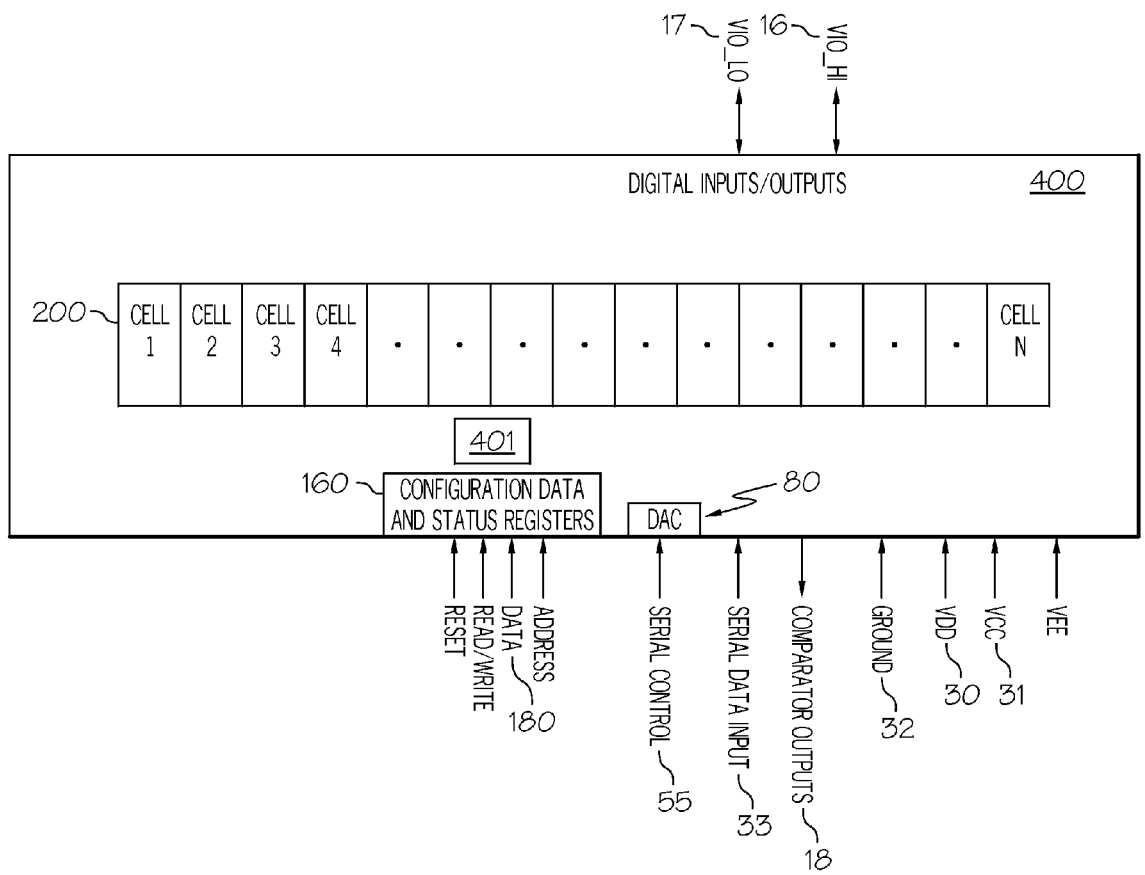
FIG. 3 is simplified chip and pin out diagram for an ASIC containing a plurality of control cells with their respective exemplary reconfigurable multi-purpose digital interfaces.

FIG. 2 illustrates a configuration control system 100 for each cell 200 (See FIG. 3). A "cell" as defined herein refers to the I/O circuit 50 and its corresponding configuration control system 100. A configuration control system 100 may comprise configuration logic 140, a plurality of switch or FET drivers 120 and a configuration data and status register 160. The cell 200 communicates with one or more external busses (not shown) that communicate configuration data to and receives status from each cell 200 via an address decoder 170 and a data bus 180.

The configuration logic 140 may reside in any suitably configured logic device (not shown). Non-limiting examples of logic devices includes a processor, a special purpose processor, dual processors, a programmable logic device, a deterministic state machine, a digital signal processor, a field programmable field array. The configuration logic 140 interprets digital serial command data 190 and then reconfigures the I/O circuit 50 in real time among the variety of modalities (1-15) by reconfiguring the switch fabric comprising switch fabric controlling the configuration of the I/O circuit 50. The switch fabric may comprise configuration switches 10, 19, 20-25 and the multiplexer 11. The switch fabric configurations corresponding to each of the exemplary modalities listed in Table 1 may be stored in one or more configuration data and status registers 160.

Data latched into the status register 160 is used by the configuration logic 140 to determine if serial data 190 is to be output on VIO_HI 16 and VIO_LO 17 by passing true or inverted serial data 190 to switches 21, 22, 24 and 25. For example, in Mode 2, when serial data 190 or inverted serial data 190 is passed to these transistors via the FET drivers 120, the outputs on VIO_HI 16 and VIO_LO 17 conform to the RS485 standard.

When the cell is not in Mode 2, the configuration data in the configuration and status register 160 together with the configuration logic 140 and the FET drivers 120 determines which transistors are to be energized. In Mode 3, switch 20 may be energized to provide $V_{DD}$ to pin VIO_HI 16. In Mode 4, switch 23 may be energized to provide $V_{DD}$ to pin VIO_LO 17. In Mode 5, switch 21 may be energized to provide $V_{CC}$ on pin VIO_HI 16. In Mode 6, switch 24 may be energized to provide $V_{CC}$ on pin VIO_LO 17. In Mode 7, switch 22 may be energized to provide ground to pin VIO_HI 16. In Mode 8, switch 25 may be energized to provide ground to pin VIO_LO 17. In Modes 1 and 9 through 16, switches 20 through 25 are not energized as the pins VIO_HI 16 and VIO_LO 17 are used to receive data from external devices.

In Mode 9, data latched into the configuration data and status register 160 is used to close configuration switch 27 to provide a wetting current to external devices connected to pin VIO_HI 16. In Mode 10, data latched into the configuration data and status register 160 is used to close configuration switch 27 to provide a wetting current to external devices connected to pin VIO_LO 17.

The configuration data and status registers 160 may be implemented in any type of memory device that exists or that may exist in the future. Non-limiting examples of suitable memory devices include a random access memory (RAM), read only memory (ROM), flash memory, programmable read only memory (PROM), electronically erasable programmable read only memory (EEPROM), and the like.

The configuration data and status registers may be read from or written to via various means. One method consists of an address bus 171 and an address decoder 170. Other methods of reading and writing the value in the configuration and status register includes the use of various serial busses including the standard serial SPI and I2C busses and the like as may be known in the art.

FIG. 3 is a simplified exemplary schematic of application-specific integrated circuit 400 (ASIC) on a single chip. The ASIC 400 may contain any number of cells 200, each cell controlling an I/O circuit 50. Each ASIC 400 may include a configuration block 401 wherein the address decoder 170, address bus 171 and the data bus 180 may input information for dispersal to each cell 200 on the ASIC 400.

The ASIC 400 may contain a common DAC 80. The DAC 80 may used for special circumstances or special BIT queries that may be implemented on a low duty cycle basis. For example, DAC 80 may be connected to any cell 200 on the ASIC 400 by commanding a specific multiplexer 11 to connect the DAC 80 output to the inverting terminal of its comparator 12 by activating input connection S5. Further, each ASIC 400 will have a VIO_Hi and VIO_Lo, output pins 18 and serial data input pins 33 for each cell 200.

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention. It being understood that various changes may be made in the function and arrangement of elements described in an exemplary embodiment without departing from the scope of the invention as set forth in the appended claims.

What is claimed is:

1. A digital input/output (I/O) circuit re-configurable to perform a plurality interface functions, the digital I/O circuit comprising:
   means for biasing a input signal when the digital I/O circuit is in a first configuration and for attenuating the input signal when the digital I/O circuit is in a second configuration, the means for biasing and attenuating comprising an input and an output;

means for comparing the input signal to a threshold voltage having a first input and a second input, the first input and the second input of the means for comparing being connected to the output of the means for biasing and attenuating;

means for transmitting an output signal from the digital I/O circuit that is the input of the means for biasing and attenuating; and means for re-configuring the digital I/O circuit between the first configuration, and the second configuration.

2. The digital I/O circuit of claim 1, wherein the means for biasing and attenuating is also a means for powering the digital interface circuit in a third configuration.

3. The digital I/O circuit of claim 1, further comprising a means for injecting a wetting current to an external switch coupled to the input of the means for biasing and attenuating.

4. The digital I/O circuit of claim 1, further comprising a means for switchably connecting one of a plurality of threshold voltages to a second input of the means for comparing.

5. The digital I/O circuit of claim 1, wherein the means for transmitting comprises a plurality of means for injecting various DC voltages at the input of the means for biasing and attenuating.

6. The digital I/O circuit of claim 5, wherein the means for transmitting comprises a means for grounding the input of the means for biasing and attenuating.

7. The digital I/O circuit of claim 1, wherein the means for re-configuring the digital I/O circuit between the first configuration, and the second configuration is driven by a configuration logic.

8. The digital I/O circuit of claim 1, wherein the means for re-configuring is a switch fabric.

9. An input/output (I/O) cell comprising:
a plurality of switch drivers;
a computing device configured to control the plurality of switch drivers; and
a reconfigurable I/O circuit adapted to periodically receive an input signal and to periodically transmit an output signal, the I/O circuit comprising:
means for biasing the input signal when the digital I/O circuit is in a first configuration and for attenuating the input signal when the digital I/O circuit is in a second configuration, the means for biasing and attenuating comprising an input and an output,
means for comparing the input signal to a threshold voltage, the input of the means for comparing being connected to the output of the means for biasing and attenuating,
at least two signal input/output pins that function as both the physical output for an output signal from the digital I/O circuit and a physical input for the means for biasing and attenuating, and
means for re-configuring the digital I/O circuit between the first configuration, and the second configuration in response to the switch drivers.

10. The I/O cell of claim 9, further comprising a configuration data and status register in communication with the switch drivers and the computing device.

11. The I/O cell of claim 10 further comprising a digital-to-analog converter (DAC), the DAC being configured to provide an adjustable threshold voltage to the means for comparing.

12. The I/O cell of claim 11, further comprising a means for switchably connecting one of a plurality of fixed threshold voltages and the DAC to the means for comparing.

13. The I/O cell of claim 9, wherein the means for transmitting comprises a plurality of means for injecting various DC voltages at the input of the means for biasing and attenuating.

* * * * *